US009588139B2

(12) United States Patent
Fan et al.

(10) Patent No.: US 9,588,139 B2
(45) Date of Patent: Mar. 7, 2017

(54) PROBE CARD ASSEMBLY FOR TESTING ELECTRONIC DEVICES

(71) Applicant: FormFactor, Inc., Livermore, CA (US)

(72) Inventors: Li Fan, San Ramon, CA (US); Darcy K. Kelly-Greene, Pleasanton, CA (US); Edward J. Milovic, Danville, CA (US); Gensaku Nagai, Tokyo (JP); Mukesh K. Selvaraj, Livermore, CA (US); Jim Zhang, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 116 days.

(21) Appl. No.: 14/270,235

(22) Filed: May 5, 2014

(65) Prior Publication Data

US 2014/0327461 A1    Nov. 6, 2014

Related U.S. Application Data

(60) Provisional application No. 61/820,080, filed on May 6, 2013.

(51) Int. Cl.
*G01R 1/067* (2006.01)
*G01R 35/00* (2006.01)
*G01R 1/36* (2006.01)
*G01R 1/073* (2006.01)

(52) U.S. Cl.
CPC ..... *G01R 1/06716* (2013.01); *G01R 1/06727* (2013.01); *G01R 1/06733* (2013.01); *G01R 1/07371* (2013.01); *G01R 35/00* (2013.01); *G01R 1/07342* (2013.01); *G01R 1/36* (2013.01)

(58) Field of Classification Search
CPC ...................................................... G01R 1/067

USPC ........................................................ 324/750
See application file for complete search history.

(56) References Cited

U.S. PATENT DOCUMENTS

| | | | |
|---|---|---|---|
| 5,457,392 A * | 10/1995 | Filipescu | G01R 1/06788 324/149 |
| 6,945,827 B2 | 9/2005 | Grube et al. | |
| 7,047,638 B2 | 5/2006 | Eldridge et al. | |
| 7,868,636 B2 | 1/2011 | Chung | |
| 7,960,989 B2 | 6/2011 | Breinlinger et al. | |
| 2002/0008530 A1 | 1/2002 | Kim et al. | |
| 2004/0012403 A1* | 1/2004 | Richmond, II | G01R 1/0491 324/750.3 |
| 2005/0024073 A1 | 2/2005 | Kim et al. | |

(Continued)

OTHER PUBLICATIONS

International Search Report, PCT patent application PCT/US2014/036859, (WIPO) (Sep. 25, 2014), 4 pages.

(Continued)

*Primary Examiner* — Son Le
*Assistant Examiner* — Akm Zakaria
(74) *Attorney, Agent, or Firm* — Lumen Patent Firm

(57) ABSTRACT

A probe card assembly can comprise a guide plate comprising probe guides for holding probes in predetermined positions. The probe card assembly can also comprise a wiring structure attached to the guide plate so that connection tips of the probes are positioned against and attached to contacts on the wiring structure. The attachment of the guide plate to the wiring structure can allow the wiring structure to expand or contract at a greater rate than the guide plate. The probes can include compliant elements that fail upon high electrical current and thermal stresses located away from the contact tips.

31 Claims, 6 Drawing Sheets

(56) References Cited

U.S. PATENT DOCUMENTS

| | | | |
|---|---|---|---|
| 2007/0046304 A1* | 3/2007 | Mok | G01R 1/07342 |
| | | | 324/750.05 |
| 2007/0139061 A1 | 6/2007 | Eldridge et al. | |
| 2008/0197869 A1 | 8/2008 | Miyagi et al. | |
| 2009/0219042 A1 | 9/2009 | Sasaki et al. | |
| 2010/0134128 A1* | 6/2010 | Hobbs | G01R 31/2889 |
| | | | 324/750.28 |
| 2010/0134129 A1 | 6/2010 | Breinlinger et al. | |
| 2010/0207652 A1 | 8/2010 | Chung et al. | |
| 2010/0327896 A1 | 12/2010 | Lee | |
| 2012/0242363 A1 | 9/2012 | Breinlinger et al. | |
| 2013/0135001 A1* | 5/2013 | Breinlinger | G01R 1/067 |
| | | | 324/754.03 |
| 2014/0118016 A1 | 5/2014 | Breinlinger | |
| 2014/0253154 A1* | 9/2014 | Kang | G01R 31/2889 |
| | | | 324/750.03 |

OTHER PUBLICATIONS

Written Opinion of the International Searching Authority, PCT patent application PCT/US2014/036859, (WIPO) (Sep. 25, 2014), 9 pages.

International Preliminary Report on Patentability, PCT patent application PCT/US2014/036859, (WIPO) (Nov. 10, 2015), 10 pages.

\* cited by examiner

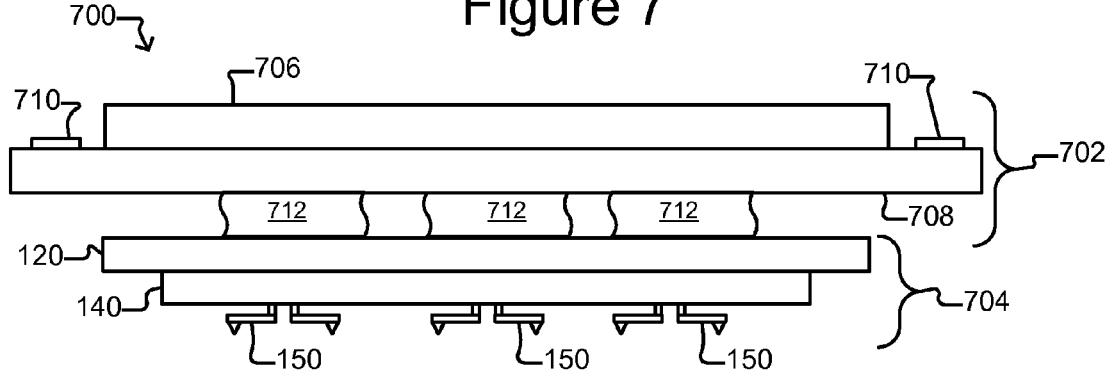
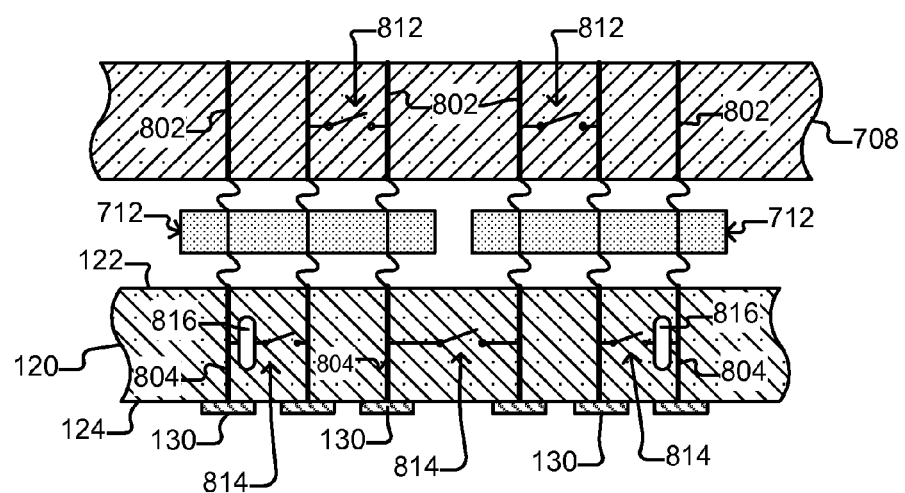

PROBE CARD ASSEMBLY FOR TESTING ELECTRONIC DEVICES

CROSS REFERENCE TO RELATED APPLICATION(S)

This application is a non-provisional (and thus claims the benefit) of U.S. provisional patent application Ser. No. 61/820,080 (filed May 6, 2014), which is incorporated by reference herein in its entirety.

BACKGROUND

Probe card assemblies are devices that can provide an interface between a tester for controlling testing of an electronic device and the electronic device. Embodiments of the present invention are directed to various improvements in such probe card assemblies.

SUMMARY

In some embodiments, a contact probe can comprise a flexure element and a compliant connection element. The flexure element can include a contact tip disposed to contact a first electronic device disposed in a plane of the contact tip. The compliant connection element can include a connection tip disposed to contact a second electronic device disposed in a plane of the connection tip. There can be an electrically conductive path from the contact tip to the connection tip.

In some embodiments, a probe card assembly can comprise a wiring structure and guide plate. The wiring structure can include electrical contacts on a first side thereof. The guide plate can be attached to the wiring structure and can include probe guides from a first side to a second side thereof. Contact probes can be disposed in the probe guides. Each of the contact probes can include a compliant connection element that extends from the second side of the guide plate, and a compliant connection element can have a connection tip in contact with (e.g., attached to) one of the electrical contacts on the first side of the wiring structure. The connection element can be compliant in a first plane that is substantially parallel to the first side of the wiring structure.

BRIEF DESCRIPTION OF THE DRAWINGS

FIG. 7 shows another example of a probe card assembly according to some embodiments of the invention.

FIGS. 8A and 8B illustrate an example of a self test configuration for probe card assembly according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the figures may show simplified or partial views, and the dimensions of elements in the figures may be exaggerated or otherwise not in proportion. In addition, as the terms "on," "attached to," "connected to," "coupled to," or similar words are used herein, one element (e.g., a material, a layer, a substrate, etc.) can be "on," "attached to," "connected to," or "coupled to" another element regardless of whether the one element is directly on, attached to, connected to, or coupled to the other element or there are one or more intervening elements between the one element and the other element. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "substantially" thus allows for minor, insignificant variations from an absolute or perfect state, dimension, measurement, result, or the like such as would be expected by a person of ordinary skill in the field but that do not appreciably affect overall performance. When used with respect to numerical values or parameters or characteristics that can be expressed as numerical values, "substantially" means within ten percent. The term "ones" means more than one. The term "disposed" encompasses within its meaning "located."

Figure 1:
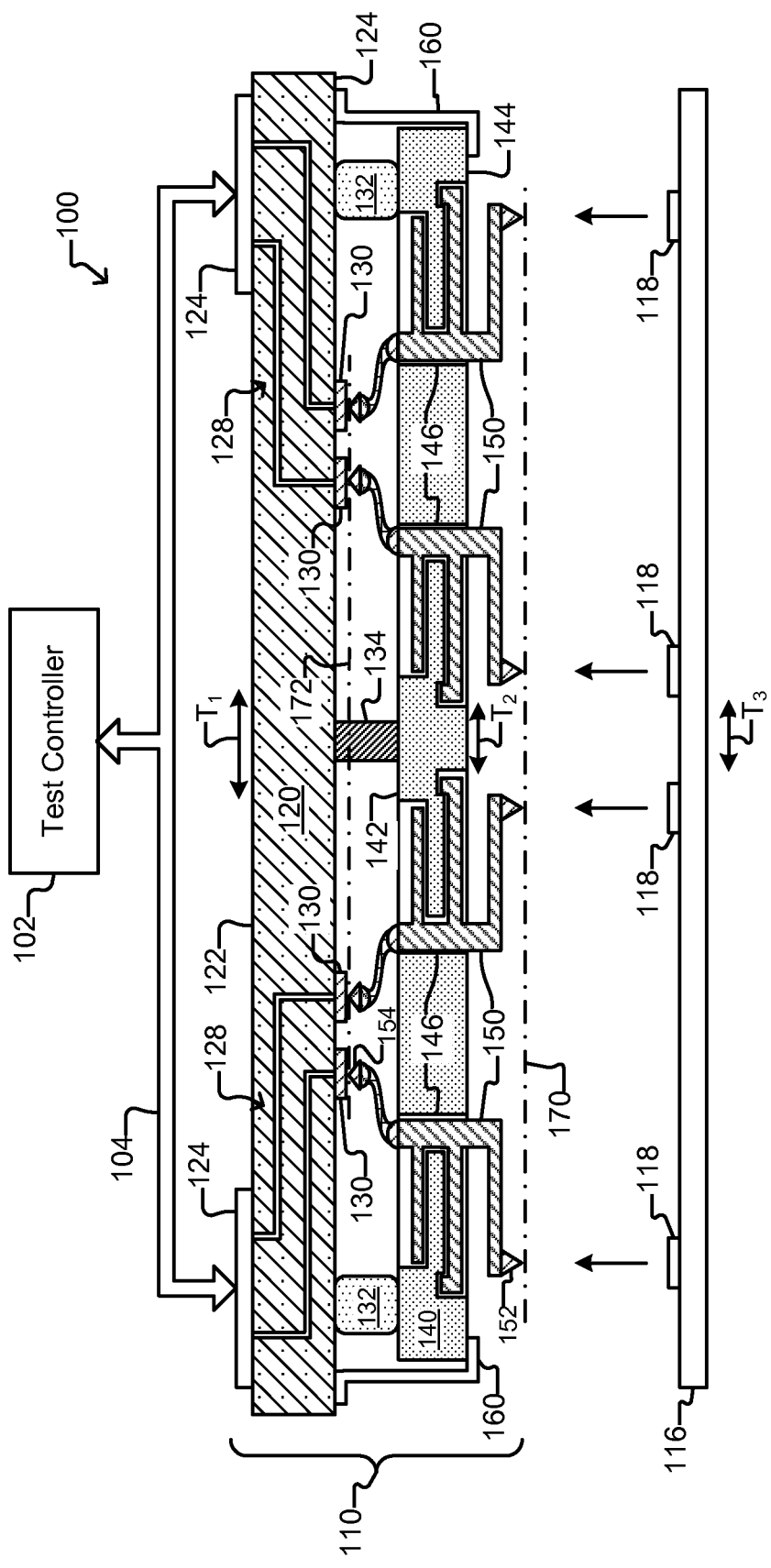
FIG. 1 illustrates a test system comprising a probe card assembly with a guide plate for holding probes according to some embodiments of the invention.

In some embodiments of the invention, a probe card assembly can comprise a guide plate, which can have probe guides for holding probes in predetermined positions. The probe card assembly can also comprise a wiring structure attached to the guide plate so that connection tips of the probes are positioned against and attached to contacts on the wiring structure. The attachment of the guide plate to the wiring structure can allow the wiring structure to expand or contract at a greater rate than the guide plate, which can allow for the use of lower cost components as the wiring structure. The probes can comprise elements that fail upon high electrical current and thermal stresses located away from the contact tips FIG. 1 shows a side, cross-sectional view of an example of test system 100 for testing an electronic device (hereinafter referred to as a device under test (DUT) 116, which can be an example of a first electronic device). Examples of DUTs 116 include a semiconductor wafer comprising unsingulated dies, singulated semiconductor dies, and other electronic devices. The system 100 can comprise a test controller 102, a probe card assembly 110, and communications channels 104 connecting the probe card assembly 110 to the test controller 102. Contact tips 152 of probes 150 of the probe card assembly 110 can be brought into contact with terminals 118 of the DUT 116. The tester 102 can then control testing of the DUT 116 by providing test signals through the communications channels 104 and probe card assembly 110 to the DUT, and the tester 102 can likewise receive response signals from the DUT 116 through the probe card assembly 110 and channels 104. Alternatively, part or all of the test controller 102 can be located on the probe card assembly 110.

As shown, the probe card assembly 110 can comprise a wiring structure 120 (which can be an example of a second electronic device) and a guide plate 140. The wiring structure 120 can comprise electrical connectors 124 on one side 122 and electrical contacts 130 on an opposite side 124. Electrical connections 128 can connect the connectors 124 to the contacts 130. The wiring structure 120 can be, for example, a wiring board such as a printed circuit board, a layered ceramic wiring structure, or the like.

The guide plate 140 can comprise probe guides 146 each of which can comprise one or more passages, openings, and/or features in or through the guide plate 140. Each probe 150 can be inserted into and secured in one of the probe guides 146. The probes 150 can thereby be attached to the guide plate 140. As shown, each probe 150 can comprise a contact tip 152 for contacting a terminal 118 of the DUT 116 and a connection contact 154 for connecting to one of the contacts 130 on the first side 124 of the wiring structure 120. The probe 150 can provide an electrically conductive path between the connection tip 154 and the contact tip 152 and thus between the wiring structure 120 and the DUT 116. The contact tips 152 of the probes 150 can be disposed substantially in a plane (hereinafter a contact tip plane) 170, and the connection tips 154 can likewise be disposed substantially in a plane (hereinafter a connection tip plane) 172.

The contact tip plane 170 can be substantially parallel to the first side 124 of the wiring structure 120 and/or the second side 122 of the wiring structure 120. The connection tip plane 172 can be substantially parallel to a first side 144 of the guide plate 140, a second side surface 142 of the guide plate 140, and/or a plane (not shown) of the terminals 118 of the DUT 116. In some embodiments, the contact tip plane 170 can be substantially parallel to the connection tip plane 172.

The guide plate 140 can comprise materials that have a coefficient of thermal expansion (CTE) close to the DUT 116 (e.g., a silicon wafer). As also shown in FIG. 1, spacers 132 can be disposed between the wiring structure 120 and the guide plate 140, which act as a planarization mechanism of the guide plate 140. Although two spacers 132 are shown in FIG. 1, there can be more or fewer. For example, there can be a sufficient number of spacers 132 to provide support between the wiring structure 120 and the guide plate 140.

The guide plate 140 can be attached to the wiring structure 120. For example, an attachment mechanism 134 (e.g., one or more bolts, screws, clamps, solder, adhesive or the like) can attach the guide plate 140 to the wiring structure 120. In some embodiments, the attachment mechanism 134 can attach the guide plate 140 to the wiring structure 120 at approximately the centers of the guide plate 140 and the wiring structure 120. This can allow the wiring structure 120 to expand and contract (e.g., due to changing thermal conditions) in a plane e.g., that is substantially parallel to the contact tip plane 170, the connection tip plane 172, the first side 122 or second side 124 of the wiring structure 120, the first side 142 or second side 144 of the guide plate 140, and/or a plane (not shown) of the DUT terminals 118. The attachment mechanism 134, however, can substantially prevent the wiring structure 120 and guide plate 140 from moving with respect to each other in a direction that is substantially perpendicular to one of the foregoing planes.

As another example, clips 160 can attach the guide plate 140 to the wiring structure 120. For example, each clip 160 can be fixedly attached to the wiring structure 120, for example, with bolts, screws, clamps, solder, adhesive or the like, but the guide plate 140 can rest on a lip or ledge of the clip 160, which can allow the wiring structure 120 to expand and contract with respect to the guide plate 140 in a plane that is substantially parallel to the contact tip plane 172 generally as discussed above. The clips 160, however, can substantially resist relative movement between the wiring structure 120 and the guide plate 140 in a direction that is substantially perpendicular to one or more of those planes.

DUT 116 can be disposed on a stage (not shown) or other support that can include a temperature controller (not shown) for heating or cooling the DUT 116. The ambient temperature around the probe card assembly 110 can thus change during testing. Moreover, there can be a temperature gradient across the probe card assembly 110 (e.g., an increasing gradient generally form the second side 122 of the wiring structure 120 to the DUT 116). The foregoing and/or other temperature conditions can result in the wiring structure 120, the guide plate 140, and/or the DUT 116 expanding or contracting at different rates. In FIG. 1, thermal induced expansion or contraction of the wiring structure 120 is labeled $T_1$, of the guide plate 140 is labeled $T_2$, and of the DUT 116 is labeled $T_3$.

This can result in relative movement among the wiring structure 120, the guide plate 140, and/or the DUT 116. Excessive relative movement can result in one or more of the contact tips 152 of the probes 150 moving off of (and thus out of contact with) a corresponding terminal 118 of the DUT 116. Such movement can also result in one more of the connection tips 154 breaking free from and/or moving off of (and thus out of contact with) a corresponding contact 130.

The foregoing problems can be addressed by constructing the wiring structure 120 and the guide plate 140 to each have a substantially similar coefficient of thermal expansion (CTE) as the DUT 116. Such a wiring structure 120, however, can be relatively costly. Economical wiring structures, such as printed circuit boards, however, often have a significantly greater CTE than a typical DUT 116.

In the example of a probe card assembly 110 shown in FIG. 1, the guide plate 140 can be constructed of materials that give the guide plate 140 a CTE that is substantially the same as the CTE of the DUT 116. The wiring structure 120, however, can have a significantly greater CTE. For example, the CTE of the wiring structure 120 can be two, three, four, five, or more times the CTE of the guide plate 140. Thermal expansion or contraction $T_1$ of the wiring structure 120 can thus be significantly greater than the thermal expansion or contraction $T_2$ of the guide plate 140. As discussed above, the wiring structure 120 is attached to the guide plate 140 so as to allow relative movement of the wiring structure 120 with respect to the guide plate 140. Moreover, as will be seen, each probe 150 can be secured in one of the probe guides 146 in the guide plate 140 and compliantly connected to one of the contacts 130 to accommodate the above-discussed relative movement of the wiring structure 120.

Figure 2:
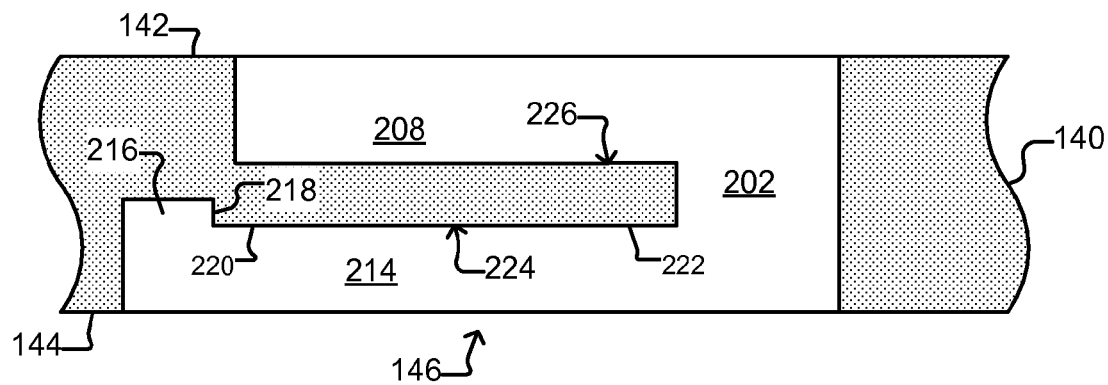
FIG. 2 is an example of a probe guide in the guide plate of FIG. 1 according to some embodiments of the invention.
Figure 3:
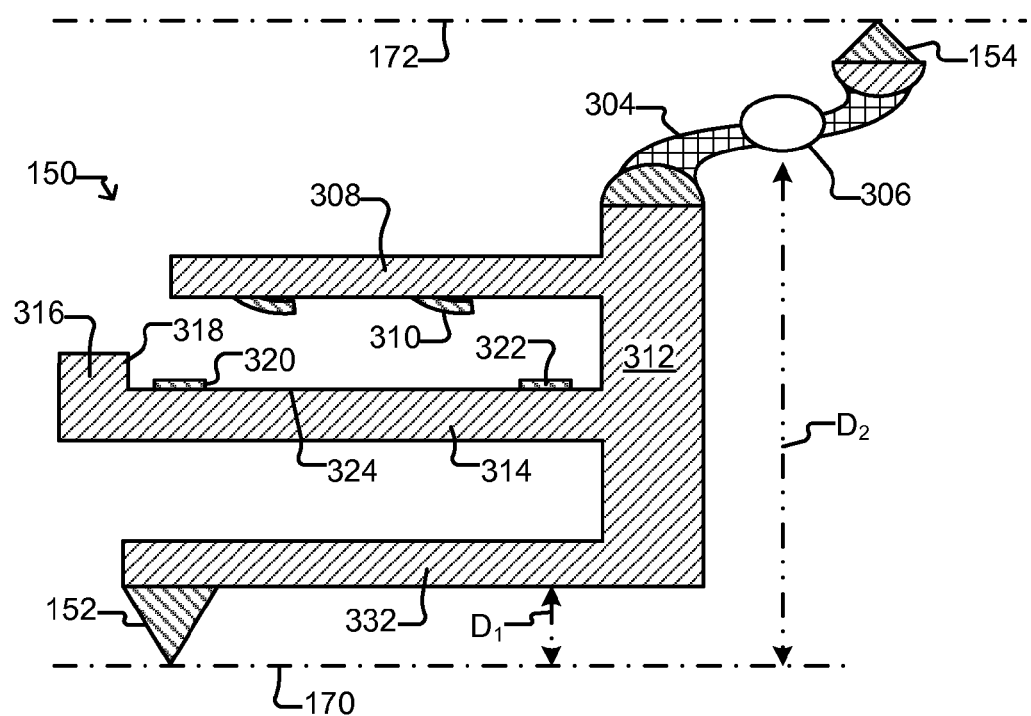
FIG. 3 shows an example of a probe that can be inserted into the probe guide of FIG. 2 according to some embodiments of the invention.
Figure 4:
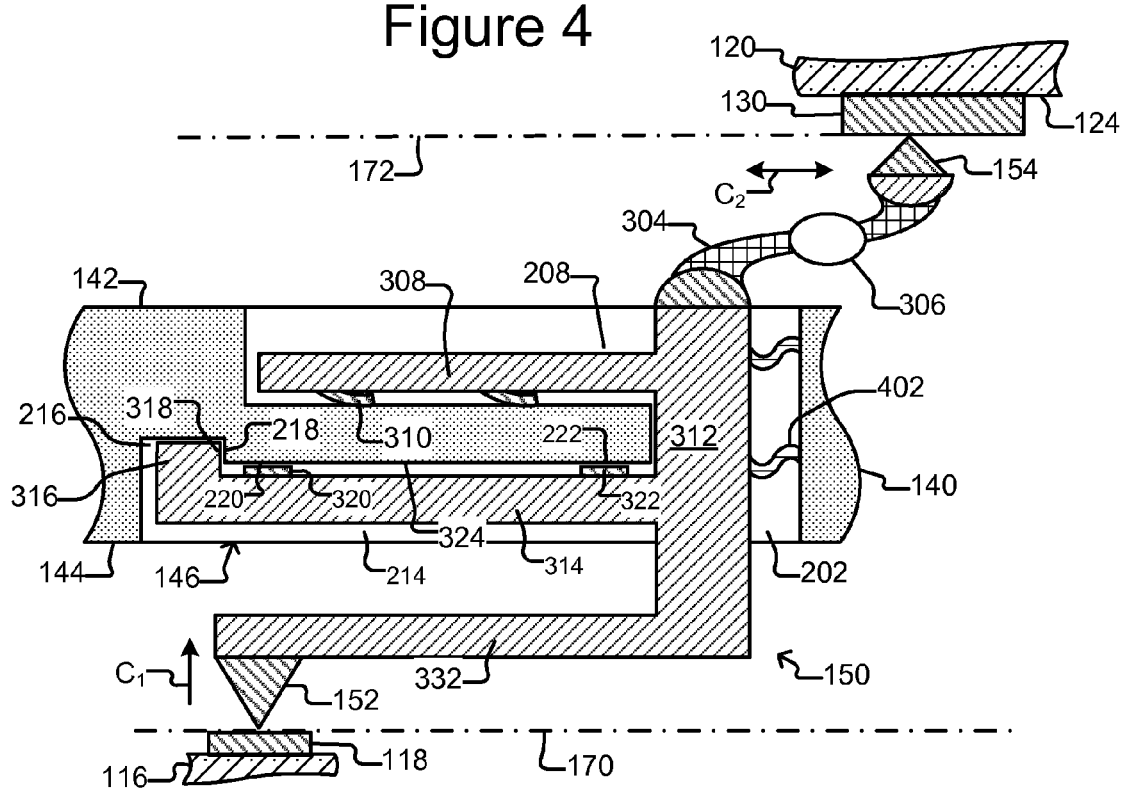
FIG. 4 shows the probe of FIG. 3 disposed in and attached to the probe guide of FIG. 2 according to some embodiments of the invention.

FIG. 2 shows an example configuration of one of the probe guides 146, and FIG. 3 is an example configuration of a probe 150. FIG. 4 shows the probe 150 inserted into and secured in the probe guide 146.

In the example illustrated in FIG. 2, a probe guide 146 can comprise a passage 202, a bottom alignment opening 208, and a top alignment opening 214. The passage 202 can be a through hole from the second side 142 of the guide plate 140 through the guide plate 140 to the first side 144. The bottom alignment opening 208 can be a cavity that extends from the passage 202 into the guide plate 140. The alignment opening 214 can be an opening in the first side 144 of the guide plate 140 that extends from the passage 202. As shown, the alignment opening 214 can comprise an alignment feature 216, and other alignment features 218, 220, 222 and 224.

As shown in FIG. 3, a probe 150 can comprise a body 312 from which an attachment element 308, an alignment element 314, and a flexure element 332 can extend. The probe 150 can also include a compliant connection element 304 that extends from the body 312 to the connection tip 154.

As can be seen in FIGS. 3 and 4, the attachment element 308 can be sized and located to the bottom alignment opening 208 of the probe guide 146. For example, the attachment element 308 can form a friction fit with the bottom alignment opening 208. The attachment element 308 can also include one or more spring structures 310 that can expand against sidewalls of the bottom alignment opening 208.

The alignment element 314 can be sized and located to fit into the alignment opening 214 of the probe guide 146. The alignment element 314 can include an alignment feature 316 that corresponds to and fits into the alignment feature 216 of the alignment opening 214. The alignment feature 216 can be located in the alignment opening 214 and the corresponding alignment feature 316 can be located on the alignment element 314 so that the contact tip 152 of the probe 150 is precisely located in a particular position with respect to the guide plate 140 while the probe 150 is inserted into and locked in place in the probe guide 146. As shown, the alignment element 314 can also comprise an alignment feature 318 that corresponds to and is located to contact the alignment feature 218 of the alignment opening 214 in the guide plate 140, an alignment feature 320 that corresponds to and is located to contact the alignment feature 220 of the alignment opening 214, and an alignment feature 322 that corresponds to and is located to contact the alignment feature 222 of the alignment opening 214. The feature alignment pairs 218/318, 220/320, 222/322 are used to precisely position the probe 150 in a desired location with respect to the guide plate 140.

The flexure element 332 can extend from the body 314 of the probe 150 to the contact tip 152. The flexure element 332 can be flexible and can thus flex or move in response to a contact force F on the contact tip 152. For example, the flexure element 332 can flex generally away from the DUT 116 in response to a contact force F. The flexure element 332 can thus provide first compliance $C_1$ (e.g., flexibility) in a direction that is substantially perpendicular to the contact tip plane 170.

The compliant connection 304 of a probe 150 can extend from the body 312 of the probe 150 to the connection contact 154, which as discussed above and shown in FIG. 4, can be in contact with one of the electrical contacts 130 on the first side 124 of the wiring structure 120. At least the flexure element 332, body 312, and compliant connection 304 of the probe 150 can be electrically conductive and thus form an electrically conductive path from the contact tip 152 (which can also be electrically conductive) to the connection tip 154 (which can be electrically conductive).

The connection tip 154 can merely be in contact with the electrical contact 130, or the connection tip 154 can be attached to the electrical contact 130. For example, an adhesive (e.g., an electrically conductive adhesive), solder, or the like (not shown) can be attached the connection tip 154 to the electrical contact 130. Alternatively, the connection tip 154 can be attached to the contact 130 utilizing mechanical contacts and/or bonding techniques such as tape-automated bonding, wire bonding, laser bonding, piezo bonding, or the like. Regardless, the compliant connection 304 can provide second compliance $C_2$ (e.g., flexibility) generally in a direction that is substantially parallel to the connection tip plane 172. As discussed above, thermal expansion or contraction differentials can cause relative movement of the wiring structure 120 with respect to the guide plate 140 in a plane that is substantially parallel to the connection tip plane 172. The second compliance $C_2$ can allow the electrical contact 130 to move with the wiring structure 120 relative to the guide plate 140 (and thus the body 312, attachment element 308, alignment element 314, and flexure element 332 of the probe 150) without breaking the attachment of the connection tip 154 to the electrical contact 130. The compliant connection element 304 can comprise a flexible or resilient material and/or a spring structure.

As shown in FIGS. 3 and 4, the compliant connection element 304 can also comprise an element 306, which can be disposed in the electrically conductive path from the contact tip 152 to the connection tip 154 and can dissipate heat generated from the flow of electricity in the path. Moreover, because the element 306 is in the compliant connection 304 away from the flexure element 332, the majority of the heat dissipated in the conductive path between the contact tip 152 and the connection tip 154 can be at the element 306 away from the flexure element 332. For example, as shown in FIG. 3, the flexure element 332 to which the contact tip 152 is attached can be a first distance $D_1$ from the contact tip plane 170, and the element 306 can be a second distance $D_2$ from the contact tip plane 170. The second distance $D_2$ can be greater than the first distance $D_1$. For example, the second distance $D_2$ can be two, three, four, five, or more times greater than the first distance $D_1$.

Figure 5:
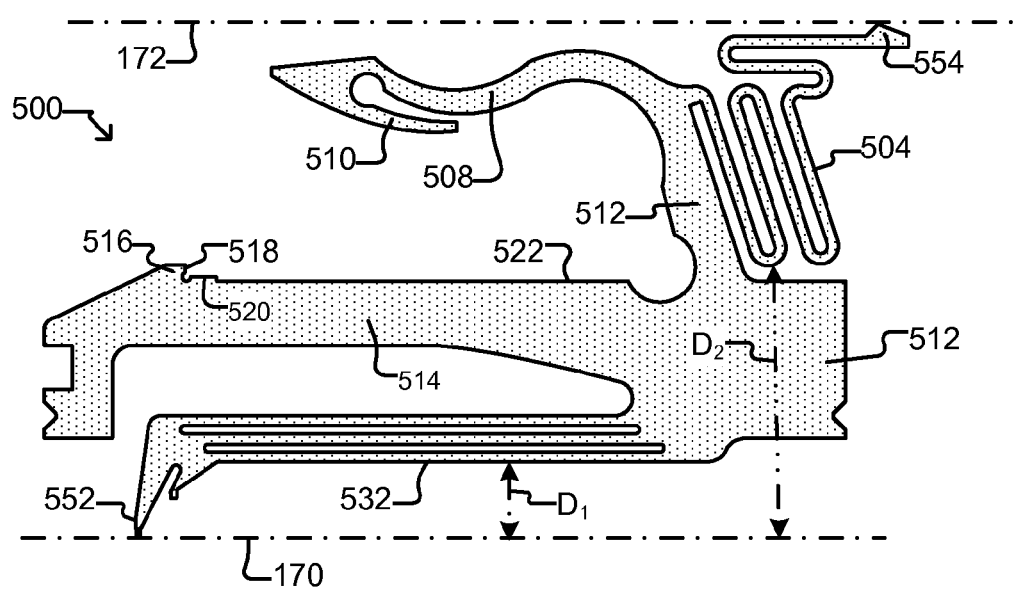
FIG. 5 is another example of a probe according to some embodiments of the invention.

The configuration of the probe 150 and corresponding probe guide 146 shown in FIGS. 2-4 are but examples, and many variations are possible. For example, the probe 150 can have fewer or more than the elements shown in FIGS. 3 and 4. As another example, the elements shown in FIG. 150 can have different shapes and be in different locations. FIG. 5 illustrates an example of a probe 500 that can be an example of the probe 150. The probe 500 can thus replace probe 150 in any figure or discussion herein.

As shown in FIG. 5, the probe 500 can comprise a contact tip 552 and a connection tip 554, which can be examples of the contact tip 152 and connection tip 154 of FIGS. 3 and 4. The probe 500 can also comprise a body 512 from which a compliant connection element 504, an attachment element 508, an alignment element 514, and a flexure element 532 can extend. The foregoing elements can be examples, respectively, of the body 312, compliant connection 304 (including element 306), attachment element 308, alignment element 314, and flexure element 332 of FIGS. 3 and 4.

As shown, the compliant connection element 504 can comprise a serpentine shape, which can provide compliance. The serpentine shape of the connection element 504 can thus be an example of the element 306 of FIGS. 3 and 4.

As also shown, the attachment element 508 can include one or more springs 510, which can be an example of the springs 310 in FIGS. 3 and 4. The alignment feature 516 and other alignment features 518, 520, 522, which can be examples, respectively, of the alignment feature 316 and other alignment features 318, 320, 322 in FIGS. 3 and 4.

Figure 6:
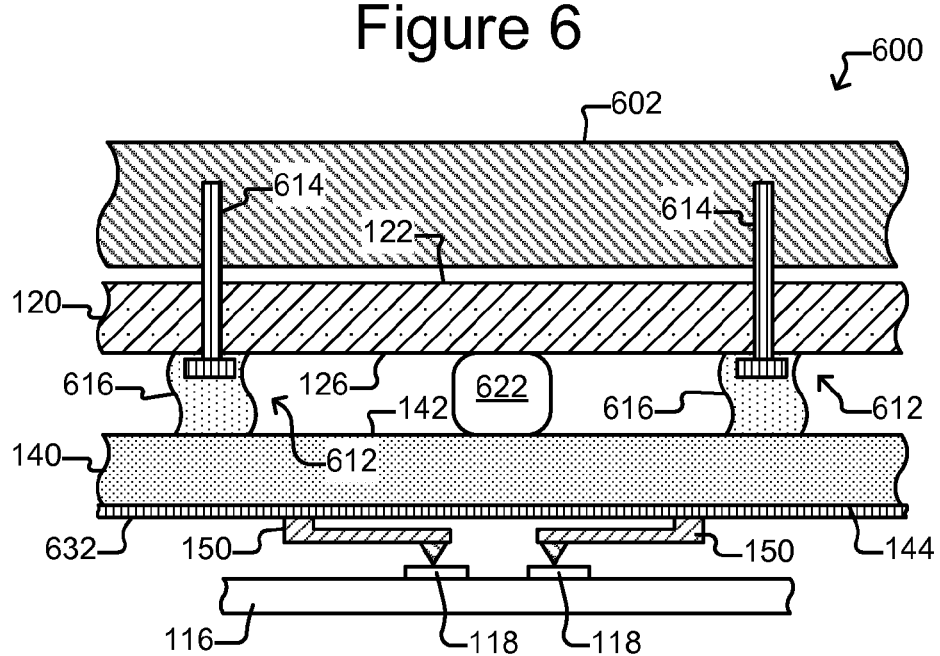
FIG. 6 illustrates an example configuration of a probe card assembly comprising thermal paths through a wiring structure according to some embodiments of the invention.

FIG. 6 illustrates an example of a variation of the probe card assembly 110 of FIG. 1. The probe card assembly 600 of FIG. 6 can be generally similar to the probe card assembly 110 of FIG. 1, and like numbered elements can be the same. As shown, however, the probe card assembly 600 can further comprise a thermal structure 602 (e.g., a structure comprising material with high thermal conductivity such as metal) and a layer of thermally insulating/conducting material 632 (which can be on both sides although shown on only the bottom side in FIG. 6) of the guide plate 140. Thermally conductive attachment structures 614 (e.g., metal screws, bolts, clamps, or the like) can couple the wiring structure 120 to the thermal structure 602. The attachment structures 614 can be more (e.g., two or more times greater) thermally conductive than the wiring structure 120 and can thus provide thermally conductive paths through the wiring structure 120 to the thermal structure 602. A thermally conductive material 616 (e.g., thermally conductive paste, adhesive, tape, or the like) can be disposed from the second surface 142 of the guide plate 140 to the attachment structures 614. Thermally conductive paths comprising the material 616 and the attachment structures 614 can thus be provided for conducting heat from the guide plate 140 through the wiring structure 120 to the thermal structure 602. In addition, other thermally conductive material 622 can be disposed between the guide plate 140 and the wiring structure 120.

Although the wiring structure 120 and guide plate 140 are illustrated in FIG. 1 and discussed above as being a probe card assembly 110, the wiring structure 120 and guide plate 140 can instead by a sub-assembly of a larger apparatus. FIG. 7 shows an example in which the combination of the wiring structure 120 and guide plate 140 are a sub-assembly 704 that is attached to other components to form a larger assembly, which can itself be a probe card assembly 700. As shown in FIG. 7, the probe card assembly 700 can comprise a reusable assembly 702 to which a sub-assembly 704 corresponding to the probe card assembly 110 of FIG. 1 can be quickly and easily attached and detached.

The reusable assembly 702 can comprise a stiffener structure 706, a primary wiring structure 708, and interposers 712, which can comprise flexible electrical connections between the primary wiring structure 708 and the wiring structure 120. The stiffener structure 706 can be, for example, a mechanically rigid (e.g., metal) structure. The primary wiring structure 708 can comprise electrical connectors 710, which can, for example, connect to channels like 104 in FIG. 1 to a tester (like tester 102). The primary wiring structure 708 can comprise electrical connections (not shown) from the connectors 710 through the primary wiring structure 708 to the interposers 712, which can provide flexible electrical connections (not shown) from the primary wiring structure 708 to the sub-assembly 704. The flexible electrical connections (not shown) of the interposers 712 can be disposed in a standard pattern.

As shown, the sub-assembly 704 can comprise the wiring structure 120 and guide plate 140 including attached probes 150 generally as illustrated in any of FIGS. 1-5 and discussed above. The connectors 124 in FIG. 1, however, can be replaced with an interface (not shown) to the interposers 712. Generally as discussed above, the wiring structure 120 can provide electrical connections from the interposers 712 to the probes 150 as discussed above.

The reusable assembly 702 and the sub-assembly 704 can each be a single assembly unit that can be readily attached to and detached from each other. For example, the sub-assembly 704 can, as a single unit, be attached to and detached from the reusable assembly 702. The reusable assembly 702 can be a standard assembly used to test several different types of DUTs (like 116) each with a different pattern of terminals 118. A unique sub-assembly 704, however, with a customized layout of probes 150 can be designed and made for each of the different types of DUTs. Each time a different type of DUT is to be tested, the sub-assembly 704 corresponding to the previous type of DUT can be detached from the reusable assembly 702, and a new sub-assembly 704 customized for the new type of DUT can be attached to the reusable assembly 702. The probe card assembly 700 of FIG. 7 can thus be customized for different types of DUTs simply by replacing the subassembly 704. The reusable assembly 702, however, can be used to test several different types of DUTs.

Figure 8B:
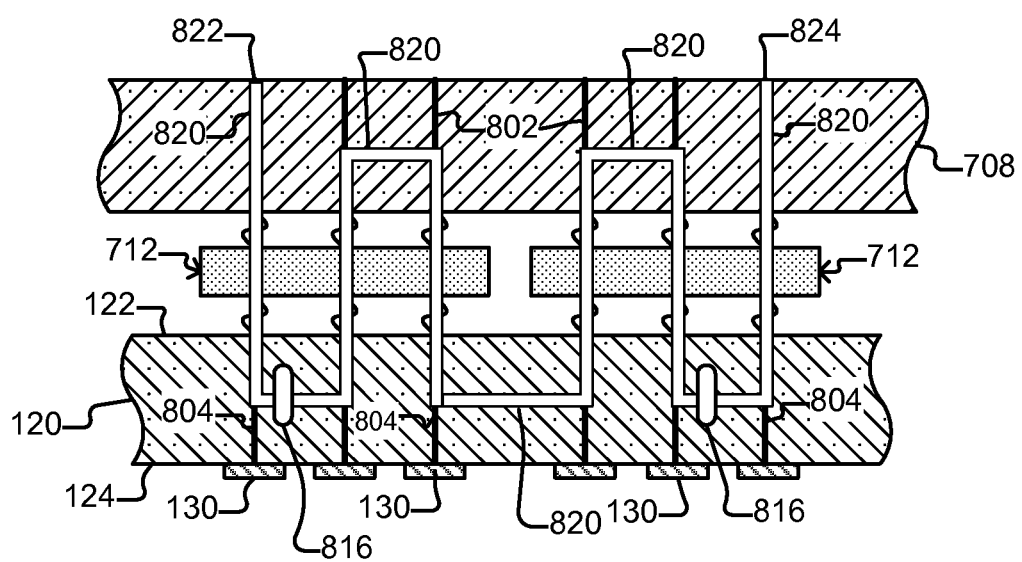

FIGS. 8A and 8B show an example of a daisy chained configuration for testing connectivity in the probe card assembly 700 of FIG. 7. Common causes for failures in a probe card assembly include connection failures of the interposers 712 to the primary wiring structure 708 or the wiring structure 120.

FIG. 8A shows a partial cross-sectional view of the primary wiring structure 708, interposers 712, and the wiring structure 120. As shown, electrical connections 802 can provide electrical paths from, for example, a connector 710 (see FIG. 7 but not shown in FIG. 8) through the primary wiring structure 708 to interposers 712 to electrical connections 804 through the wiring structure 120 to contacts 130 on the first side 122 of the wiring structure 120. As shown in FIG. 8C8A, switches 812 in or on the primary wiring structure 708 and similar switches 814 in or on the wiring structure 120, when closed (which is the state of the switches 812, 814), can create a temporary daisy chained path 820 from a first location 822 to a second location 824 that passes through a plurality of the connections between the primary wiring structure 708 and the interposers 712 and the wiring structure 120 and the interposers 712 (see FIG. 8B). If a test signal provided at the first location 822, for example, is detected at the second location 824, the connections from the interposers 712 to the wiring structures 708, 120 along the daisy-chained path 820 are good. Otherwise, at least one of the foregoing connections is bad. Indicator mechanisms 816 (e.g., lights) can be located along the path 820 to indicate that the probe card assembly 700 is in the daisy chain test mode and/or whether the test signal has passed successfully through the path 820. Once the foregoing self-test of the probe card assembly 700 is concluded, the switches 812, 814 can be opened, and the probe card assembly 700 used to test DUTs (e.g., like DUT 116).

Although specific embodiments and applications of the invention have been described in this specification, these embodiments and applications are exemplary only, and many variations are possible.

We claim:

1. A contact probe comprising:
   a single unitary structural element comprising a flexure portion and a compliant connection portion;
   a contact tip at a proximal end of said flexure portion and disposed to contact a first electronic device disposed in a plane of said contact tip; and
   a connection tip at a distal end of said compliant connection portion and disposed to contact a wiring structure of a probe card assembly that is disposed in a plane of said connection tip that is substantially parallel to said plane of said contact tip,
   said flexure portion and said compliant connection portion being parts of an electrically conductive path from said contact tip to said connection tip.

2. The contact probe of claim 1, wherein said compliant connection-portion is designed to fail upon high electrical current or thermal stresses.

3. The contact probe of claim 1, wherein:
said compliant connection portion comprises a heat dissipating feature that has at least two times greater heat dissipating capacity than said flexure portion;
said flexure portion is disposed a first distance from said plane of said contact tip, and
said heat dissipating feature is disposed a second distance from said plane of said contact tip, and
said second distance is at least two times greater than said first distance.

4. The contact probe of claim 3, wherein said heat dissipating feature comprises compliant elements spaced apart one from another.

5. The contact probe of claim 1, wherein said contact probe is sized to fit into a probe guide in a guide plate, said probe guide comprising:
an attachment feature,
a first opening from a first side of said guide plate to said attachment feature,
a second opening from a second side of said guide plate that is opposite said first side of said guide plate to said attachment feature, and
a through passage from said first side to said second side of said guide plate adjacent said attachment feature.

6. The contact probe of claim 5, wherein said single unitary structural element further comprises an attachment portion configured to fit into said first opening of said probe guide and clamp said contact probe to said attachment feature in said probe guide, thereby attaching said contact probe to said guide plate.

7. The contact probe of claim 5, wherein said single unitary structural element further comprises an alignment portion configured to fit into said second opening of said probe guide, wherein said alignment portion comprises alignment features positioned to contact corresponding constraints of said attachment feature and thereby stop, in a predetermined position with respect to said guide plate, movement of said contact probe in said probe guide caused by a force of contact of said first electronic device on said contact tip.

8. The contact probe of claim 1, wherein:
said flexure portion is compliant in a first direction in response to a force of contact of said first electronic device on said contact tip,
said compliant connection portion is compliant in a second direction, and
said first direction is substantially perpendicular to said second direction.

9. A probe card assembly comprising:
a wiring structure of a probe card assembly comprising electrical contacts disposed substantially in a plane on a first side of said wiring structure;
a guide plate attached to said wiring structure and comprising probe guides from a first side to a second side of said guide plate; and
contact probes disposed in said probe guides,
wherein each said contact probe comprises:
a single unitary structural element comprising a flexure portion that is spaced from a corresponding one of said probe guides away from said second side of said guide plate and a compliant connection portion that extends from said corresponding one of said probe guides away from said first side of said guide plate,
a contact tip at a proximal end of said flexure portion disposed to contact a first electronic device, and
a connection tip at a distal end of said compliant connection portion in contact with one of said electrical contacts on said first side of said wiring structure,
wherein:
said flexure portion and said compliant connection portion are parts of an electrically conductive path from said contact tip to said connection tip, and
said compliant connection portion is compliant in a first plane substantially parallel to said plane of said electrical contacts.

10. The probe card assembly of claim 9, wherein:
said connection tip is fixedly attached to said one of said electrical contacts, and
said compliant connection portion is sufficiently compliant for said connection tip to remain fixedly attached to said one of said electrical contacts during differential thermal expansion or contraction substantially in said plane of electrical contacts of said wiring structure with respect to said guide plate.

11. The probe card assembly of claim 9, wherein a coefficient of thermal expansion (CTE) of said wiring structure is at least two times greater than a CTE of said guide plate.

12. The probe card assembly of claim 11, wherein said wiring structure comprises a printed circuit board or a multi layered ceramic.

13. The probe card assembly of claim 9 further comprising attachment clips that attach said wiring structure to said guide plate, wherein said attachment clips:
allow relative movement of said wiring structure with respect to said guide plate substantially parallel to said plane of said electrical contacts, and
restrict relative movement of said wiring structure with respect to said guide plate in a direction that is substantially perpendicular to said plane of said electrical contacts.

14. The probe card assembly of claim 9 further comprising biasing elements positioned inside said probe guides to bias said contact probes into particular positions in said probe guides.

15. The probe card assembly of claim 9 further comprising spacers disposed between said first side of said wiring structure and said first side of said guide plate.

16. The probe card assembly of claim 9 further comprising:
thermally insulating/conducting material disposed on said both sides of said guide plate, and
thermally insulating/conductive structures creating thermally conductive paths from said first side of said guide plate through said wiring structure.

17. The probe card assembly of claim 9 further comprising a first assembly comprising:
a stiffener;
a primary wiring structure comprising electrical connections to a tester,
interposers comprising flexible electrical connections from said primary wiring structure.

18. The probe card assembly of claim 17, wherein:
said wiring structure is a secondary wiring structure,
said probe card assembly further comprises a second assembly comprising said secondary wiring structure attached to said guide plate,
said second assembly is configured to be attached to and detached from said first assembly as a single unit.

19. The probe card assembly of claim 18 further comprising electrical switches in said primary wiring structure and said secondary wiring structure that, when closed, create a daisy chained electrical path through a plurality of interconnections between said primary wiring structure and said interposers and said interposers and said secondary wiring structure.

20. The probe card assembly of claim 9, wherein said compliant connection portion comprises compliant elements that fail upon high electrical current or thermal stresses.

21. The contact probe of claim 3, wherein said heat dissipating feature comprises a serpentine region of said compliant connection portion.

22. The contact probe of claim 1, wherein:
said single unitary structural element further comprises a body portion, and
said flexure portion comprises a cantilevered beam extending laterally from said body portion, said cantilevered beam being substantially parallel to said plane of said contact tip.

23. The contact probe of claim 22, wherein:
said single unitary structural element further comprises an alignment portion and an attachment portion,
said alignment portion extends laterally from said body portion above said cantilevered beam and there is a first space between said alignment portion and said cantilevered beam, and
said attachment portion extends laterally from said body portion above said alignment portion and there is a second space between said attachment portion and said alignment portion.

24. The contact probe of claim 23, wherein said contact probe is sized to fit into a probe guide in a guide plate with:
said body portion of said single unitary structural element disposed in a through passage of said probe guide,
said attachment portion clamping said contact probe to an attachment feature in said probe guide, and
said attachment feature disposed in said second space between said attachment portion and said alignment portion.

25. The contact probe of claim 24, wherein said alignment portion comprises at least three alignment features configured to contact corresponding constraints of said attachment feature and thereby align said contact probe in said probe guide along all three axes of an x, y, z coordinate system.

26. The probe card assembly of claim 9, wherein:
said compliant connection portion comprises a heat dissipating feature that has at least two times greater heat dissipating capacity than said flexure portion;
said flexure portion is disposed a first distance from a plane of said contact tips of said contact probes, and
said heat dissipating feature is disposed a second distance from said plane of said contact tips of said contact probes, and
said second distance is at least two times greater than said first distance.

27. The probe card assembly of claim 9, wherein:
said single unitary structural element further comprises a body portion, and
said flexure portion comprises a cantilevered beam extending laterally from said body portion, said cantilevered beam being substantially parallel to said plane of said electrical contacts of said wiring substrate.

28. The probe card assembly of claim 27, wherein:
said single unitary structural element further comprises an alignment portion and an attachment portion,
said alignment portion extends laterally from said body portion above said cantilevered beam and there is a first space between said alignment portion and said cantilevered beam, and
said attachment portion extends laterally from said body portion above said alignment portion and there is a second space between said attachment portion and said alignment portion.

29. The probe card assembly of claim 28, wherein each said contact probe is disposed in a corresponding one of said probe guides with:
said body portion of said single unitary structural element of said contact probe disposed in a through passage of said corresponding one of said probe guides, and
said attachment portion of said single unitary structural element of said contact probe clamping said contact probe to an attachment feature in said corresponding one of said probe guides, and
said attachment feature in said corresponding one of said probe guides disposed in said second space between said attachment portion and said alignment portion.

30. The probe card assembly of claim 29, wherein said alignment portion comprises at least three alignment features configured to contact corresponding constraints of said attachment feature and thereby align said contact probe in said corresponding one of said probe guides along all three axes of an x, y, z coordinate system.

31. A contact probe, comprising:
a body comprising a flexure portion extending from a first end of the body and a compliant connection portion extending from a second end of the body;
a contact tip at a proximal end of said flexure portion and disposed to contact a first electronic device disposed in a plane of said contact tip;
a connection tip at a distal end of said compliant connection portion and disposed to contact a second electronic device disposed in a plane of said connection tip that is substantially parallel to said plane of said contact tip;
a first alignment feature configured to fit in a first alignment opening of a probe guide, the first alignment feature extending in substantially the same direction as the flexure portion; and
a second alignment feature configured to fit in a second alignment opening of the probe guide, the second alignment feature extending in substantially the same direction as the flexure portion;
wherein said flexure portion and said compliant connection portion are part of an electrically conductive path from said contact tip to said connection tip,
wherein said flexure portion is compliant in the direction of the first or second alignment feature when said first electronic device contacts said contact tip,
wherein said compliant connection portion is compliant when said second electronic device contacts said connection tip.

* * * * *